ated Patent [19]

United States Patent [19]
Cummings

[11] 4,140,980
[45] Feb. 20, 1979

[54] COMPENSATION CIRCUIT FOR TRAILING EDGE DISTORTION OF PULSE-WIDTH MODULATED SIGNAL

[75] Inventor: Forest M. Cummings, Richardson, Tex.

[73] Assignee: Rockwell International Corporation, El Segundo, Calif.

[21] Appl. No.: 881,097

[22] Filed: Feb. 24, 1978

[51] Int. Cl.² .................... H03K 5/01; H03K 6/04; H03K 7/08
[52] U.S. Cl. .................... 332/9 T; 307/263; 307/268; 325/65; 325/142; 328/34; 332/18; 332/37 R; 332/63
[58] Field of Search .......... 332/9 R, 9 T, 18, 37 R, 332/63; 328/34, 35; 307/260, 263, 268; 325/65, 142

[56] References Cited

U.S. PATENT DOCUMENTS

3,094,627  6/1963  VanLottum .................. 307/263 X
3,588,744  6/1971  Swanson ...................... 332/9

Primary Examiner—Siegfried H. Grimm
Attorney, Agent, or Firm—Bruce C. Lutz; Howard R. Greenberg; H. Frederick Hamann

[57] ABSTRACT

When a pulse-width series modulator is connected to the cathode of an RF radio transmitter tube for the purpose of series modulation, filtration of the PWM switching signal is required to eliminate the switching signal from the output modulating signal. Stray capacitive effects in this filtration generate undesirable distortion in the trailing edge of the signal appearing in the last stage of the PWM thereby producing non-linearity in the modulation of the RF output tube. The present disclosure illustrates circuitry for complimentarily modifying the leading edge of the pulses so as to maintain a linear relationship in the time integral of voltage in the output signal. This modification is accomplished through a plurality of capacitive units each having different time constants for charging and discharging.

6 Claims, 5 Drawing Figures

$C_1$ CHARGES THRU $R_1$ (VIA $CR_1$)
$C_1$ DISCHARGES THRU $R_2$ AND $Q_1$ $C_2$ CHARGES THRU $R_3 + R_1$ (VIA $CR_1$)
$C_2$ DISCHARGES THRU $R_3 + R_2$ AND $Q_1$ $C_3$ CHARGES THRU $R_1$
$C_3$ DISCHARGES THRU $Q_1$ (NO R)

C₁ CHARGES THRU R₁ (VIA CR₁)

C₁ DISCHARGES THRU R₂ AND Q₁

C₂ CHARGES THRU R₃ + R₁ (VIA CR₁)

C₂ DISCHARGES THRU R₃ + R₂ AND Q₁

C₃ CHARGES THRU R₁

C₃ DISCHARGES THRU Q₁ (NO R)

COMPENSATION CIRCUIT FOR TRAILING EDGE DISTORTION OF PULSE-WIDTH MODULATED SIGNAL

THE INVENTION

The present invention is generally concerned with electronics and more specifically is concerned with providing linear changes in output signals as compared to input signals. Even more specifically it is concerned with modifying the leading edge of a pulse-width modulated pulse to compensate for reactive effects that distort the trailing edge of the signals later in the apparatus.

Whenever an RF tube is cathode modulated using a series modulator incorporating pulse-width modulation (PWM), heavy filtering is required between the RF output tube and the modulator tube to eliminate the PWM switching signal from the modulating signal. Stray capacity at the input of this filter distorts the trailing edge of the signal as output by the modulator tube thereby preventing a linear relationship between the input and output signal over the range of pulse-width modulation.

The prior art has attempted to provide compensation for this effect through a further inductor such as shown in a Swanson U.S. Pat. No. 3,588,744. While the prior art does provide compensation, after a fashion, it is believed that the present invention concept performs the function in a less expensive manner by using less components having less total weight. Since it uses a different approach to solving the problem the present idea is also believed patentable.

The prior art detects the total amount of current being drawn by a pulse-width modulated stage and uses this information to adjust for the distortion of the signals in a later stage. The present invention on the other hand uses a plurality of capacitors each of which has different time constants for charge and discharge characteristics of operation determines the amount of distortion provided to the leading edge of the pulse-width modulated signal in the second half cycle of operation. However, as in the prior art, the desire is that the time integral of voltage or area under the output signal maintain a constant relationship with respect to the input signal producing the pulse-width modulated outputs.

In view of the above, it is an object of the present invention to provide an improved circuit for compensation of distortion caused by reactive elements in a circuit.

Other objects and advantages of the invention will be apparent from a reading of the specification and appended claims in conjunction with the drawings wherein:

DETAILED DESCRIPTION

Figure 1:
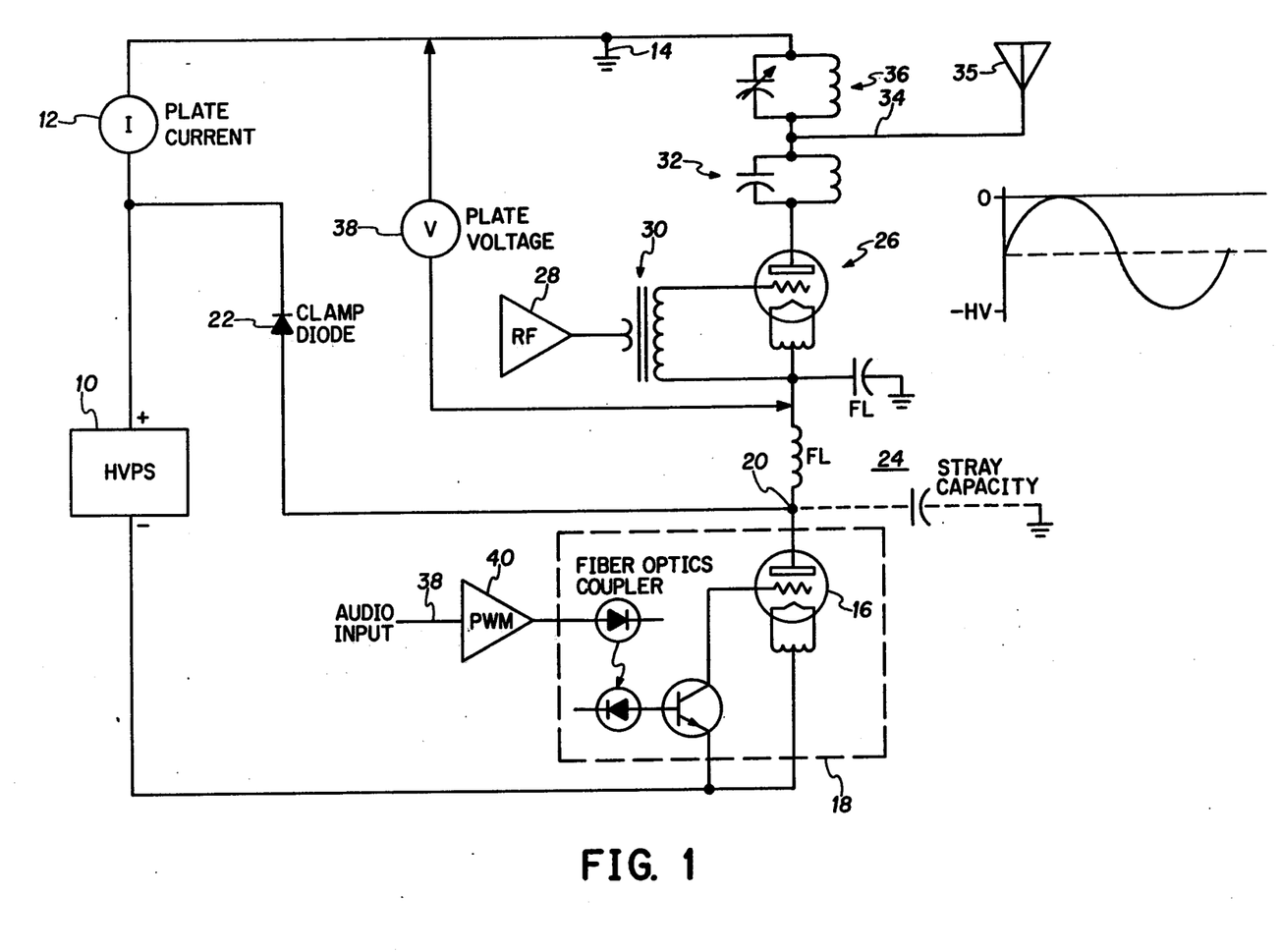
FIG. 1 is a block schematic diagram of an RF transmitter incorporating the present inventive concept.
Figure 5:
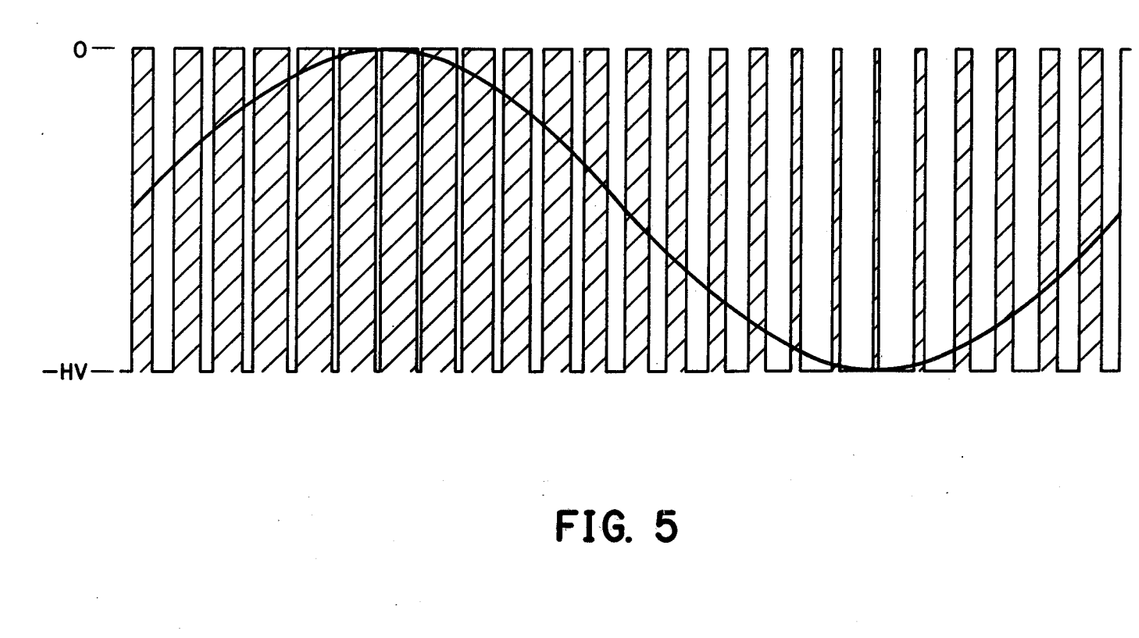
FIG. 5 is a waveform used in explaining the operation of the circuit of FIG. 1.

In FIG. 1 a high voltage power supply 10 supplies current through a plate current meter 12 to ground 14. The negative terminal of this power supply is connected to a cathode of a modulator tube 16 within a dash line block 18. An anode or plate of tube 16 is connected to a junction point 20 which is connected through a clamp diode 22 to the positive terminal of power supply 10. Junction point 20 is also connected through a low-pass filter generally designated as 24 to the cathode of an RF output tube 26. Tube 26 is driven by an RF source 28 through a transformer coupling device 30. Tube 26 is essentially a power amplifier and provides output signals from an anode through a first tuning circuit 32 to an output terminal 34 and on to an antenna 35. Output terminal 34 is connected through further tuning circuitry 36 to ground 14. A plate voltage meter 38 is connected between ground 14 and the cathode of tube 26. As illustrated in FIG. 5, a theoretical pulse-width modulated signal appears at junction point 20 which is filtered by filter 24 and produces an analog wave representation of the pulse-width modulated signal (superimposed on FIG. 5 and shown in FIG. 1) at the cathode of power amplifier 26. A signal, usually audio frequency, input to be converted to pulse-width modulated signals appears on a lead 38 and is converted in a pulse-width modulator 40 before being applied to block 18. Within block 18 the signal is coupled via fiber optic means to an amplifier, which is the subject of this invention before being applied to the grid of tube 16.

Figure 2:
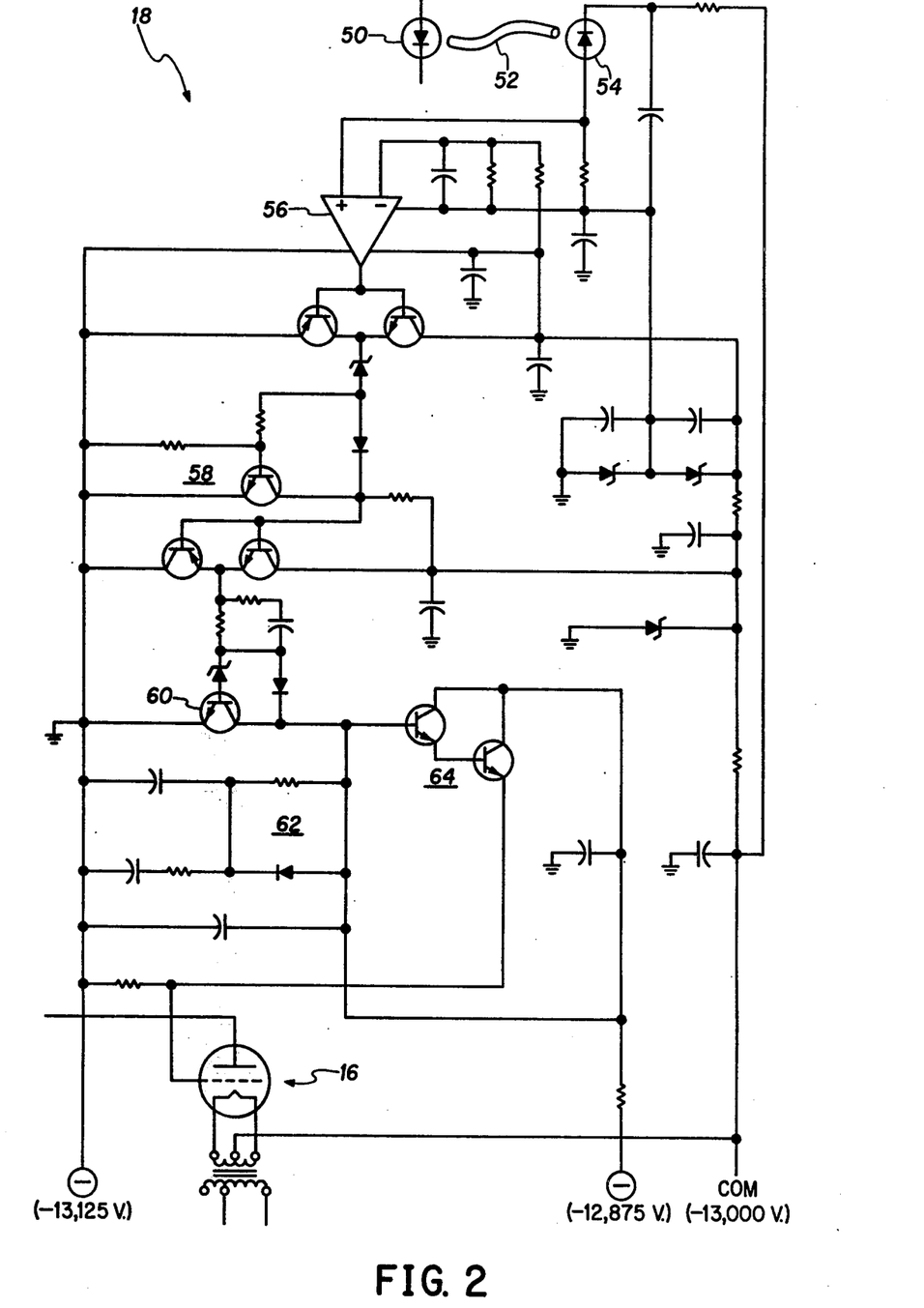
FIG. 2 is a detailed circuit schematic of a portion of FIG. 1 incorporating the present invention.

The circuitry shown in FIG. 2 is essentially the circuitry within block 18 of FIG. 1. As illustrated, an LED 50 produces light signals which vary in accordance with the input signal on 38 as modified by the pulse-width modulator 40 and transmits the signals through fiber optic cable 52 to a photosensitive diode 54. The output of this diode 54 is amplified by an amplifier 56 and further amplification circuitry generally designated as 58. These signals are applied to a transistor 60 as pulse-width modulated signals having the idealized waveform illustrated in FIG. 5. These signals are modified in the capacitive section generally designated as 62 before being applied to a Darlington connected emitter follower amplifier stage 64 and then being applied to the series modulator tube 16. As the signal arrives at tube 16, only the leading edge of the pulses is modified. However, the trailing edge of these pulses is modified by the stray capacity at the anode of tube 16 and the attempt of the present invention is to keep the area under the waveforms representative of the time integral of voltage at a constant relationship with respect to the audio signal 38.

Figure 3:
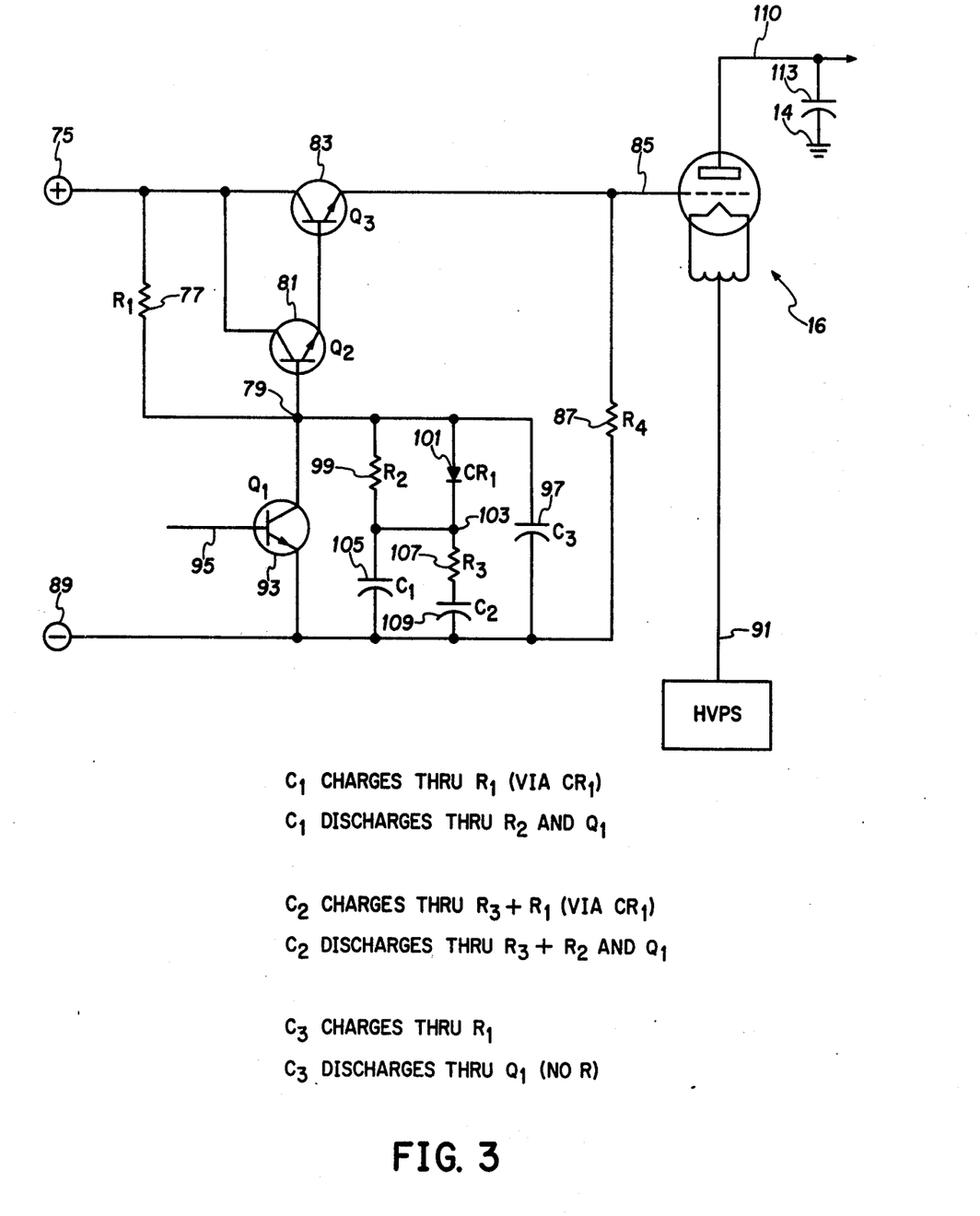
FIG. 3 is a detailed schematic diagram of a portion of FIG. 2 for ease in explaining the invention.

In FIG. 3 a positive terminal 75 is connected through a resistor 77 to a junction point 79 which is further connected to a base of an NPN transistor 81. The emitter of transistor 81 is connected to the base of an NPN transistor 83 wherein the two collectors are connected together and to positive terminal 75. Thus, transistors 81 and 83 are connected in a Darlington pair configuration with the emitter of transistor 83 connected to a grid 85 of the modulator tube 16. Grid 85 is connected through a resistor 87 to a negative power terminal 89. The cathode of tube 16 is connected through an inductive element used for heating the cathode to a high voltage negative power supply terminal 91 which would be a part of power supply 10 of FIG. 1. A transistor 93 (which is the same as transistor 60 of FIG. 2) has a base 95 connected for receiving undistorted PWM signals from the amplifying section 58 of FIG. 2 and a collector connected to junction point 79. An emitter of transistor 93 is connected to negative potential 89. A capacitor 97 is connected between junction point 79 and terminal 89. A resistor 99 is connected in parallel with a diode 101 between junction point 79 and a further junction point 103. A capacitor 105 is connected between junction point 103 and negative terminal 89. A resistor 107 is connected in series with a capacitor 109 between junction point 103 and negative terminal 89. A plate of tube 16 is connected to an output lead 110 and a capacitor 113 is indicated as being connected between output 110 and ground 14 and represents stray capacitance. This stray capacitance is caused by the circuit design and capacitances internal to tube 16 and cannot be conveniently eliminated from the circuit. This capacitance causes distortion of the trailing edge of the PWM signal thereby requiring a circuit such as the present to compensate for this distortion.

The waveforms in FIG. 4a are illustrative of the signal at the plate of tube 16 for conditions as labeled of a wide pulse for the tube being ON and thus a narrow pulse of the tube being OFF, a medium pulse, a narrow pulse and a very narrow pulse. The transistor 93 has inverted operating conditions from those of tube 16 and the waveforms shown in FIG. 4b are representative of the voltage at the collector of transistor 93 under the same conditions as shown in FIG. 4a. Thus, the pulse labeled as wide is indicative of transistor 93 being OFF for a long time and ON for a very short time. Under the next three sets of conditions labeled medium, narrow and very narrow, the ON time of transistor 93 increases. As will be noted, the trailing edge of each of the pulses in the waveforms of FIG. 4b are very perpendicular and undistorted. However, the trailing edge of the signals of waveforms 4a vary from extremely little distortion for wide pulse widths to a consideration amount of distortion at very narrow pulse widths. The phenomena to be corrected is explained in the referenced Swanson patent and will be further explained infra.

The waveform of FIG. 5 illustrates the idealized pulse-width modulation as theoretically supplied by PWM 40. A sine wave representative of the input on 38 to produce the PWM is illustrated and upon filtration (demodulation) this same sine wave would again be produced. As must be emphasized, this is an idealized waveform and is not produced exactly because of the various capacitive and inductive effects occurring within the circuit.

OPERATION

As previously indicated, the stray capacity at the input of the low-pass filter 24 as illustrated in FIG. 1 affects the trailing edge of the pulse used in the pulse-width modulation of current flowing through power amplifier tube 26. The back EMF of the inductor therein attempts to continue current flow through tube 26 after tube 16 turns OFF. Because of the stray capacity, the trailing edge of the voltage waveform varies from a sharp cutoff relative to the total pulse width when the tube is ON for a long time as shown by the first curve in FIG. 4a to a sloped curve forming a considerable percentage of total pulse width as shown by the "very narrow" pulse in the last waveform of FIG. 4a. The deviation from "sharp" cutoff is shown by a hatched area starting when the tube 16 is turned OFF while current is still flowing. The arrow indications above each of the pulses illustrate the pulse width as applied to the grid of tube 16. The solid waveform on the other hand illustrates the trailing edge deviation which actually occurs due to the stray capacity. Thus, the leading edge is modified by the circuit of FIG. 3 so that the total time integral of voltage or "pulse area" remains the same as if the pulse applied to the grid of tube 16 had passed through to affect the current in tube 26 in a linear and square wave number. As previously explained, waveforms 4a and 4b are effectively inverted from one another since waveform 4b is the input signal to the grid of tube 16 as modified by the circuit of FIG. 3 while FIG. 4a shows the corresponding waveforms at the plate of tube 16 and these waveforms are completely representative of the current passing through tube 26.

In FIG. 1 an input signal is applied on lead 38 to the pulse-width modulator 40 which provides an output signal which is transmitted via the voltage isolation effects of the fiber optics coupler to the grid of tube 16. The pulse-width modulation of tube 16 affects the current through the power amplifier 26 in accordance with the input signal and thus amplitude modulates the RF applied by amplifier 28. Thus an AM signal is applied to the antenna 35 and broadcast to receiving stations.

As explained in the referenced Swanson patent, the stray capacity affects the input/output signal ratio linearity for very small pulses and thus the pulse applied to tube 16 is modified.

As shown in FIG. 2, the signal received as a pulse-width modulated signal from 40 is received by the fiber optics isolation unit, amplified by sections 56 and 58 before being applied to the leading edge modifier illustrated in FIG. 3 and starting with transistor 60 of FIG. 2.

In FIG. 3, it may be assumed that a square wave signal is applied on lead 95 such that transistor 93 is OFF for a comparatively long time and thus the tube 16 is ON for a long time. Under these conditions the inductor in filter 24 stores enough energy to very quickly discharge the stray capacitive effects which have been charged to the minus 13,000 volts. However, as the tube 16 is turned ON for shorter and shorter periods of time, the energy stored in the inductance of filter 24 is significantly less and thus it takes a longer time to discharge the capacitive effects. As may be determined, the area under the hatched lines is representative of the discharge of these stray capacitive effects and with very little energy, due to short tube ON times, in the very narrow waveform of FIG. 4a, it takes a considerable amount of time to discharge these capacitive effects and bring the plate of tube 16 to the ground potential whereby no further current is flowing through the power amplifier tube 26.

Since the deleterious effects on the output signal are caused by the discharging of a capacitor, the present invention uses as a compensatory effect the charging of a capacitor. This charging effect was not conveniently available from a single capacitor and thus the three capacitors 97, 105 and 109 are used in a combination to produce the desired effect of reducing the pulse value from the maximum available as a function of pulse width wherein the shorter pulses are distorted the most.

To provide an even more detailed understanding of the circuitry of FIG. 3 the following component values are herein provided for one embodiment of my invention:

| | |
|---|---|
| Resistor 77 | 820 Ohms |
| Resistor 87 | 33,000 Ohms |
| Resistor 99 | 1,500 Ohms |
| Resistor 107 | 2,200 Ohms |
| Transistors 81, 83 & 93 | 2N6575 |

| -continued | |
|---|---|
| Diode 101 | 1N5418 |
| Capacitor 97 | 470 Picofarads |
| Capacitor 105 | 2,200 Picofarads |
| Capacitor 109 | 1,500 Picofarads |

Figure 4:
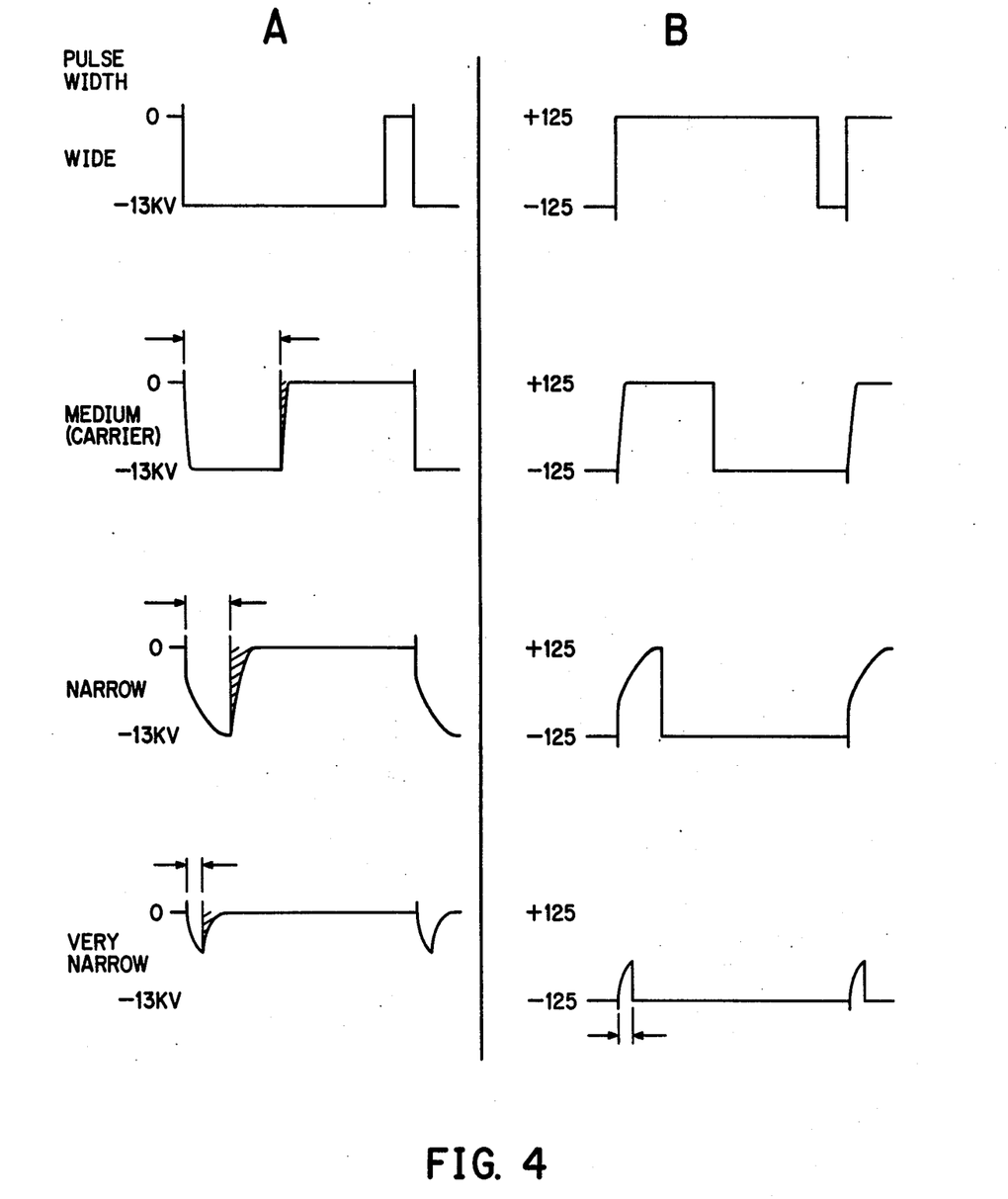
FIG. 4 comprises a series of waveforms for use in explaining the operation of the circuit of FIG. 3.

In the situation of wide pulses as indicated on the top set of waveforms in FIG. 4 there is only a slight rounding of the pulse at the leading edge to compensate for an almost unnoticeable trailing edge rounding. This rounding on the leading edge is accomplished by the charging of capacitor 97 when transistor 93 turns OFF and the voltage at junction point 79 attempts to rise to the potential of input lead 75. Since transistor 93 is connected directly across capacitor 97, the turning ON of transistor 93 will discharge capacitor 97 almost immediately. However, it does not charge up immediately since it must receive current through resistor 77. Capacitor 105 also receives its charging current through resistor 77 however, the discharging of capacitor 105 must take place through resistor 99 which is a fairly high value. Since transistor 93 is only ON for a very short time under the assumed conditions, capacitor 105 remains at nearly a full charge at all times and thus does not substantially affect the leading edge of the pulse. Capacitor 109 must discharge through both resistors 107 and 99 and thus it also does not affect the leading edge of the incoming pulse.

Proceeding to the narrow waveform in the penultimate position of FIG. 4 it will be noted that there is considerable distortion on the leading edge of the pulse defining the OFF time of transistor 93 and thus the ON time of tube 16. The first portion of the waveform, where it is fairly straight, is due to the sharing of charge between capacitors 105 and 109 through resistor 107. Because these capacitors must discharge through resistors 107 and 99 when the transistor 93 is in the ON condition, they do get more discharged than under the conditions of the above paragraph. However, they still do not become completely discharged and thus form a pedestal of voltage on the leading edge of the waveform and then continue to charge up more slowly through the resistances 77 and 107 and the diode 101. As the very narrow pulses in the last waveform of FIG. 4 are reached, capacitors 105 and 109 are totally discharged through resistors 99 and 107 during the time that transistor 93 is on. Thus the leading edge of the waveform is quite rounded to properly compensate for the rounding of the trailing edge due to the stray capacity 113 at the anode of the switch tube 16.

By proper selection of the ratios of capacitors 97, 105 and 109, and at the same time proper selection of resistors 77, 99 and 107, the charge sharing and charge/discharge times can be made to compensate for the particular stray capacity and nominal pulse width at zero modulation. Since the nominal pulse width sets the carrier power level, proper compensation maintains desired performance over all the various carrier power levels and modulation levels thereof.

Under the last waveform of FIG. 4 the times for the transistor 93 to be OFF and accordingly the time for tube 16 to be ON is very narrow. Thus, it is assumed that all of the capacitors 97, 105 and 109 are completely discharged at the time transistor 93 turns OFF. Under these conditions the waveform is sloped all the way to the point at which the pulse-width modulated pulse again turns transistor 93 ON. Therefore the tube, as shown in the very narrow waveform of FIG. 4a, is never fully turned ON before it starts turning OFF however the total area under the waveform curve is the same as if it had turned fully ON to the minus 13,000 volts for the time indicated between the arrows due to the distortion of the waveform in this time compensating for the area in the hatched portion of this waveform.

While a single embodiment of the inventive concept has been illustrated, other ways of practicing the present invention will be apparent to one skilled in the art and I thus wish to be limited only by the scope of the appended claims.

I claim:

1. A variable rise time circuit comprising, in combination:
   output signal means for supplying an output signal indicative of an input signal as modified by the after described circuit;
   potential reference means;
   first means for supplying current through a first impedance to said output signal means;
   second means connected to said output signal means for shorting same to said reference potential means in response to and for a time determined by said input signal;
   first capacitor means connected in parallel with said second means;
   second impedance means and unidirectional current means connected in parallel and at one end to said output signal means;
   second capacitor means connected between said reference potential means and the other end of said parallel connection of said second impedance means and said unidirectional means;
   third impedance means and third capacitor means serially connected in parallel with said second capacitor means, the rise time of signals at said output signal means increasing directly as a function of the shorted time of said second means.

2. Apparatus for adjusting the shape of the leading edge of a PWM (pulse-width modulated) signal as a function of pulse-width comprising, in combination:
   first means for supplying said PWM signal;
   capacitive multiple section second means, including output signal means, for providing output signals generated in accordance with composite voltages in the multiple sections, (wherein charging and discharging occurs at different rates in different sections);
   third means, connected to said second means, for supplying charging currents thereto; and
   fourth means, connected to said first means and said second means, for discharging capacitors therein in accordance with the PWM signal whereby more of said capacitive sections become substantially fully discharged as the discharge time is increased.

3. The method of adjusting the leading edge of a PWM (pulse-width modulated) signal to vary in slope as a function of pulse-width comprising, the steps of:
   adjusting the charging and discharging rates of a plurality of capacitors so that an increasing number of capacitors become discharged as the time allowed for discharge increases;
   charging and discharging the capacitors as a function of the characteristics of the PWM signal; and
   outputting a signal indicative of the composite of voltages across the capacitors.

4. Compensation circuitry for use in a PWM (pulse-width modulated) system wherein capacitive effects variably affect the trailing edge of pulses as a function of pulse-width comprising, in combination:
- a plurality of capacitive means each having different charge and discharge time constants;
- signal means supplying a PWM signal;
- further means connected to said signal means, for charging and discharging said plurality of capacitive means in accordance with the PWM signal; and
- signal output means, connected to said capacitive means, for providing output signal pulses wherein the leading edge of the pulses vary as a function of the pulse-width.

5. Circuit apparatus for equalizing pulse trailing edge distortion effects on a PWM (pulse-width modulated) signal caused by reactive components wherein the distortion varies as a function of pulse-width comprising, in combination:
- PWM signal supplying means; and
- variable time constant means, connected to said PWM signal supplying means, for varying the shape of the leading edge of pulses passing therethrough to maintain the time integral of voltage pulses, after distortion by said reactive components and said variable time constant means, in direct linear relationship to the width of pulses supplied by said PWM signal supplying means.

6. The method of equalizing pulse trailing edge distortion effects on a PWM (pulse-width modulated) signal caused by reactive components within a circuit wherein the distortion varies as a function of pulse-width comprising the single step of varying the shape of the leading edge of PWM pulses applied thereto to maintain the time integral of voltage pulses, after distortion by said reactive components and the slope variation of the leading edges, in direct linear relationship to the width of pulses originally received.

* * * * *

UNITED STATES PATENT AND TRADEMARK OFFICE
CERTIFICATE OF CORRECTION

PATENT NO. : 4,140,980
DATED : February 20, 1979
INVENTOR(S) : Forest M. Cummings It is certified that error appears in the above-identified patent and that said Letters Patent are hereby corrected as shown below:

Column 1, line 29, delete "invention" and substitute therefor --inventive--;

line 39, after "characteristics" insert --wherein the amount of discharge time allowed in a first half cycle--.

Column 4, line 5, delete "number" and substitute therefor --manner--.

Signed and Sealed this

Eleventh Day of September 1979

[SEAL]

Attest:

LUTRELLE F. PARKER
Attesting Officer
Acting Commissioner of Patents and Trademarks